US008095342B2

(12) United States Patent
Grigoryan et al.

(10) Patent No.: US 8,095,342 B2
(45) Date of Patent: Jan. 10, 2012

(54) SYSTEMS AND METHODS FOR HIGHLY EFFICIENT BIT ERROR RATE MODELING IN QUASI-LINEAR COMMUNICATION NETWORKS

(75) Inventors: Vladimir S. Grigoryan, Elkridge, MD (US); Harshad P. Sardesai, Ellicott City, MD (US)

(73) Assignee: Ciena Corporation, Linthicum, MD (US)

( * ) Notice: Subject to any disclaimer, the term of this patent is extended or adjusted under 35 U.S.C. 154(b) by 680 days.

(21) Appl. No.: 12/098,904

(22) Filed: Apr. 7, 2008

(65) Prior Publication Data

US 2009/0254317 A1  Oct. 8, 2009

(51) Int. Cl.
*G06F 7/60* (2006.01)
*G06F 17/10* (2006.01)
(52) U.S. Cl. .......................................................... 703/2
(58) Field of Classification Search ...... 703/2; 708/403, 708/520
See application file for complete search history.

(56) References Cited

U.S. PATENT DOCUMENTS 7,764,745 B2 *  7/2010  Ho et al. ........................ 375/267

OTHER PUBLICATIONS

Sinkin et al, "Accurate Probabilistic Treatment of Bit-Pattern-Dependent Nonlinear Distortions in BER Calculations for WDM RZ Systems," Lightwave Technology, Journal of , vol. 25, No. 10, pp. 2959-2968, Oct. 2007.*

Ronald Holzlohner, V. S. Grigoryan, C. R. Menyuk, W. L. Kath; "Accurate Calculation of Eye Diagrams and Bit Error Rates in Optical Transmission Systems Using Linearization"; Journal of Lightwave Technology, vol. 20, No. 3, Mar. 2002; IEEE 2002.

R. Holzlohner, C. R. Menyuk, W. L. Kath, V. S. Grigoryan; "A Covariance Matrix Method for the Efficient and Accurate Computation of Eye Diagrams and Bit Error Rates"; Presentation: University of Maryland Baltimore County, Baltimore, MD, Northwestern University, Evanston, IL; Fall 2002.

R. Holzlohner, C. R. Menyuk, W. L. Kath, V. S. Grigoryan; "A Covariance Matrix Method for Accurate Bit Error Rates in a DWDM CRZ System"; Presentation: University of Maryland Baltimore County, Baltimore, MD, Northwestern University, Evanston, IL; OFC 2003.

Ronald Holzlohner; Thesis dense—Computer Science and Electrical Engineering, University of Maryland Baltimore County, 2003.

* cited by examiner

*Primary Examiner* — Dwin M Craig
*Assistant Examiner* — Aniss Chad
(74) *Attorney, Agent, or Firm* — Clements Bernard PLLC; Christopher L. Bernard; Lawrence A. Baratta Jr.

(57) ABSTRACT

The present invention provides systems and methods for highly efficient bit error rate (BER) modeling in quasi-linear communication networks. In the present invention, nonlinear noise is treated within a linearization approach along with the amplified spontaneous emission (ASE) noise, and the nonlinear noise is considered as another source of noise in addition to the ASE noise. This enables a quasi-analytical approach to the BER calculation. First, a covariance matrix is analytically computed. An equation is derived for a noise component of a signal and an implicit analytical solution is found depending on the signal and system parameters. Second, probability distribution functions (pdfs) are computed for the signal. An analytical calculation is performed of the characteristic function for the noise statistics. Next, a numerical computation of the Fourier transform of the characteristic function is performed to yield the pdf, and numerical integration is performed on the pdfs to yield the BER.

20 Claims, 5 Drawing Sheets

SYSTEMS AND METHODS FOR HIGHLY EFFICIENT BIT ERROR RATE MODELING IN QUASI-LINEAR COMMUNICATION NETWORKS

FIELD OF THE INVENTION

The present invention relates generally to communication networks. More particularly, the present invention provides systems and methods for highly efficient bit error rate (BER) modeling in quasi-linear communication networks.

BACKGROUND OF THE INVENTION

In communication systems, bit error rate (BER) is a ratio of the number of bits, elements, characters, blocks, etc. incorrectly received to the total number of bits, elements, characters, blocks, etc. sent during a specified time interval. BER is one of the most fundamental and robust measurements of performance in a digital transmission system. Note, for high transmission rate communication systems, BER is estimated based on a signal bit rate determined over a measurement period. For example, to test a communication system at 10 Gb/s for a BER of $10^{-12}$, a test would require several hours. However, to test a communication system at 10 Gb/s for a BER of $10^{-15}$, the test would require months. Accordingly, BER is typically modeled based on computation techniques known in the art.

Optical communication systems, such as dense wavelength division-multiplexed (DWDM) systems, require repeated bit error rate (BER) computations for system optimization in a multi-dimensional parameter space. In order for any BER computation technique to become a practical engineering tool, it is highly desirable to reduce the computational (computer processing unit (CPU)) time to a few minutes or less for a single processor computer and to provide high computation accuracy at the same time. Despite dramatic progress in modeling wavelength division-multiplexed (WDM) fiber communication systems made in recent decades, computationally-efficient and accurate BER calculation still remains a challenge.

There are four state-of-the art computation techniques for calculating BER: 1) direct computation of BER using Monte Carlo simulations, 2) multi-canonical Monte Carlo simulation or importance sampling techniques, 3) indirect computation method (Q-factor technique), and 4) Karhunen-Loéve expansion technique. In the direct Monte-Carlo technique and the multi-canonical Monte Carlo (or importance sampling) technique, the BER is computed directly. In the Q-factor technique, the BER is computed indirectly in two steps. First, a Q-factor is computed as a cumulant of the signal statistics. Second, by assuming a pre-determined shape of the signal probability distribution function (pdf), the signal pdf is inferred and the BER is calculated for a given Q-factor. In the Karhunen-Loéve expansion technique, the BER is computed for each bit of a pseudo-random bit sequence (PRBS) individually and the final pdf is found by averaging over all the bits in the PRBS. The core element in all four aforementioned techniques is use of long pseudo-random bit sequences that are needed for adequate accuracy of the BER computations.

Directly computing the BER using Monte Carlo simulations is prohibitively inefficient. Use of the multi-canonical Monte Carlo simulation or importance sampling techniques drastically increases the computational efficiency. However, the later two approaches still require typically long (more than one hour) CPU time which is often too long for practical use. Drawbacks of the Q-factor approach are twofold. First, there is always a tradeoff between the Q-factor calculation accuracy itself and the pseudo-random bit sequence (PRBS) word length, which requires running fairly long PRBS words resulting in long CPU times. Second, fitting parameters, which depend on the modulation format, are required to couple the Q-factor with the BER. These fitting parameters are inferred from the BER measurements. However, once the modulation format (or bit rate, or the receiver type) is changed the fitting parameters have to be re-defined again.

If the real signal pdf derived from the first principles depending on the system parameters is known, the BER could be determined directly without the fitting parameters. It is the lack of knowledge of the actual pdf which makes the BER modeling so inefficient. Use of the Karhunen-Loéve expansion technique helps to significantly increase the BER computation accuracy. However, it still requires the split-step Monte Carlo simulations with at least a $2^7-1$ PRBS length to account for the data pattern dependent nonlinear signal distortion leading to increased CPU time. A common drawback in all four abovementioned techniques is that they all need long PRBS for adequate accuracy of the BER computations which results in long CPU times.

BRIEF SUMMARY OF THE INVENTION

In various exemplary embodiments, the present invention provides systems and methods for highly efficient bit error rate (BER) modeling in quasi-linear communication networks. In the present invention, nonlinear noise, e.g. four-wave mixing (FWM), cross-phase modulation (XPM), etc., is treated within a linearization approach along with the amplified spontaneous emission (ASE) noise, and the nonlinear noise is considered as another source of noise in addition to the ASE noise. Such linearization allows us to find a unified covariance matrix which determines a multi-variant Gaussian process for an optical signal statistics due to the combined ASE and the nonlinear noise. This enables a quasi-analytical approach to the BER calculation. First, a covariance matrix is found. An equation is derived for a noise component of a signal and an implicit analytical solution is found depending on the signal and system parameters. The covariance matrix is analytically computed. Second, probability distribution functions (pdfs) are computed for the signal. An analytical calculation is performed for the characteristic function of the noise statistics. Next, a numerical computation of the Fourier transform of the characteristic function is performed to yield the pdf. Third, numerical integration is performed on the pdfs to yield the BER in question.

In an exemplary embodiment of the present invention, a highly efficient bit error rate modeling method for quasi-linear communication systems includes calculating a combined covariance matrix for noise; computing probability distribution functions (pdfs) from the combined covariance matrix; and integrating the probability distribution functions to provide a modeled bit error rate. The noise can include nonlinear noise and amplified spontaneous emission noise. The pdfs are characterized by a multi-variate Gaussian distribution. The nonlinear noise and amplified spontaneous emission noise are both derived based upon an analytical solution; and the nonlinear noise and amplified spontaneous emission noise are approximated as statistically independent. The combined covariance matrix, $K_{pq}$, is equal to $K_{pq}=K_{pq}^{NL}+K_{pq}^{ASE}$; $K_{pq}^{ASE}$ is a diagonal matrix of the amplified spontaneous emission noise; and $K_{pq}^{NL}$ is a matrix of the nonlinear noise, and wherein $K_{pq}^{NL}$ is responsive to data statistics of a received optical signal. Optionally, the computing pdfs includes a computation of a probability distribution function for a logical ONE and a probability distribution function for a logical ZERO; and the computation of the probability distribution function for the logical ONE and the probability distribution function for the logical ZERO each includes: analytically calculating a characteristic function from noise statistics; and numerically computing a Fourier transform of the characteristic function. Alternatively, computing pdfs includes one of a Karhunen-Loéve expansion and a simultaneous diagonalization of a receiver matrix and the combined covariance matrix. In the quasi-linear communication system, the nonlinear noise is treated within a linearization approach along with the amplified spontaneous emission noise, and the nonlinear noise is considered as another source of noise in addition to the amplified spontaneous emission noise.

In another exemplary embodiment of the present invention, a bit error rate modeling method for quasi-linear optical communication systems includes providing a plurality of parameters associated with a quasi-linear optical communication system; calculating noise in the quasi-linear optical communication system utilizing the plurality of parameters; calculating a covariance matrix responsive to the calculated noise; computing a probability distribution function (pdf) from the covariance matrix; and computing a modeled bit error rate through a Fourier integration of the pdf. The calculated noise can include nonlinear noise and amplified spontaneous emission noise; and in the optical quasi-linear communication system, the nonlinear noise is treated within a linearization approach along with the amplified spontaneous emission noise, and wherein the nonlinear noise is considered as another source of noise in addition to the amplified spontaneous emission noise. The pdf is characterized by a multi-variate Gaussian distribution. The nonlinear noise and amplified spontaneous emission noise are both derived based upon an analytical solution; and the nonlinear noise and amplified spontaneous emission noise are approximated as statistically independent. The combined covariance matrix, $K_{pq}$, is equal to $K_{pq}=K_{pq}^{NL}+K_{pq}^{ASE}$; $K_{pq}^{ASE}$ is a diagonal matrix of the amplified spontaneous emission noise; and $K_{pq}^{NL}$ is a matrix of the nonlinear noise, and wherein $K_{pq}^{NL}$ is responsive to the plurality of parameters associated with a quasi-linear optical communication system. The plurality of parameters can include one of a read optical signal waveform in a solitary ONE at a transmitter, demultiplexer parameters, receiver parameters, fiber parameters, fiber plant characteristics, noise figure of optical amplifiers, signal modulation format, and a combination thereof. The computing a pdf includes a computation of a probability distribution function for a logical ONE and a probability distribution function for a logical ZERO; and the computation of the probability distribution function for the logical ONE and the probability distribution function for the logical ZERO each includes: analytically calculating a characteristic function from noise statistics; and numerically computing a Fourier transform of the characteristic function. Optionally, the computing a pdf includes one of a Karhunen-Loéve expansion and a simultaneous diagonalization of a receiver matrix and the combined covariance matrix.

In yet another exemplary embodiment of the present invention, a highly efficient bit error rate modeling system for quasi-linear communication systems includes a data store; input/output interfaces; memory; and a processor coupled to each of the data store, the input/output interfaces, and the memory. The processor is configured to: calculate a combined covariance matrix for noise responsive to one or more input values received from the input/output interfaces, the data store, and the memory; compute probability distribution functions (pdfs) from the combined covariance matrix; and integrate the pdfs to provide a modeled bit error rate. The noise can include nonlinear noise and amplified spontaneous emission noise; in the quasi-linear communication system, the nonlinear noise is treated within a linearization approach along with the amplified spontaneous emission noise, and wherein the nonlinear noise is considered as another source of noise in addition to the amplified spontaneous emission noise; and the pdfs are characterized by a multi-variate Gaussian distribution. The nonlinear noise and amplified spontaneous emission noise are both derived based upon an analytical solution; the nonlinear noise and amplified spontaneous emission noise are approximated as statistically independent; the combined covariance matrix, $K_{pq}$, is equal to $K_{pq}=K_{pq}^{NL}+K_{pq}^{ASE}$; $K_{pq}^{ASE}$ is a diagonal matrix of the amplified spontaneous emission noise; and $K_{pq}^{NL}$ is a matrix of the nonlinear noise, and wherein $K_{pq}^{NL}$ is responsive to data statistics of a received optical signal. Optionally, to compute pdfs includes a computation of a pdf for a logical ONE and a probability distribution function for a logical ZERO; the computation of the pdf for the logical ONE and the pdf for the logical ZERO each include: analytically calculating a characteristic function from noise statistics; and numerically computing a Fourier transform of the characteristic function; and to compute pdfs can include one of a Karhunen-Loéve expansion and a simultaneous diagonalization of a receiver matrix and the combined covariance matrix.

BRIEF DESCRIPTION OF THE DRAWINGS

The present invention is illustrated and described herein with reference to the various drawings, in which like reference numbers denote like method steps and/or system components, respectively, and in which.

DETAILED DESCRIPTION OF THE INVENTION

Figure 1:
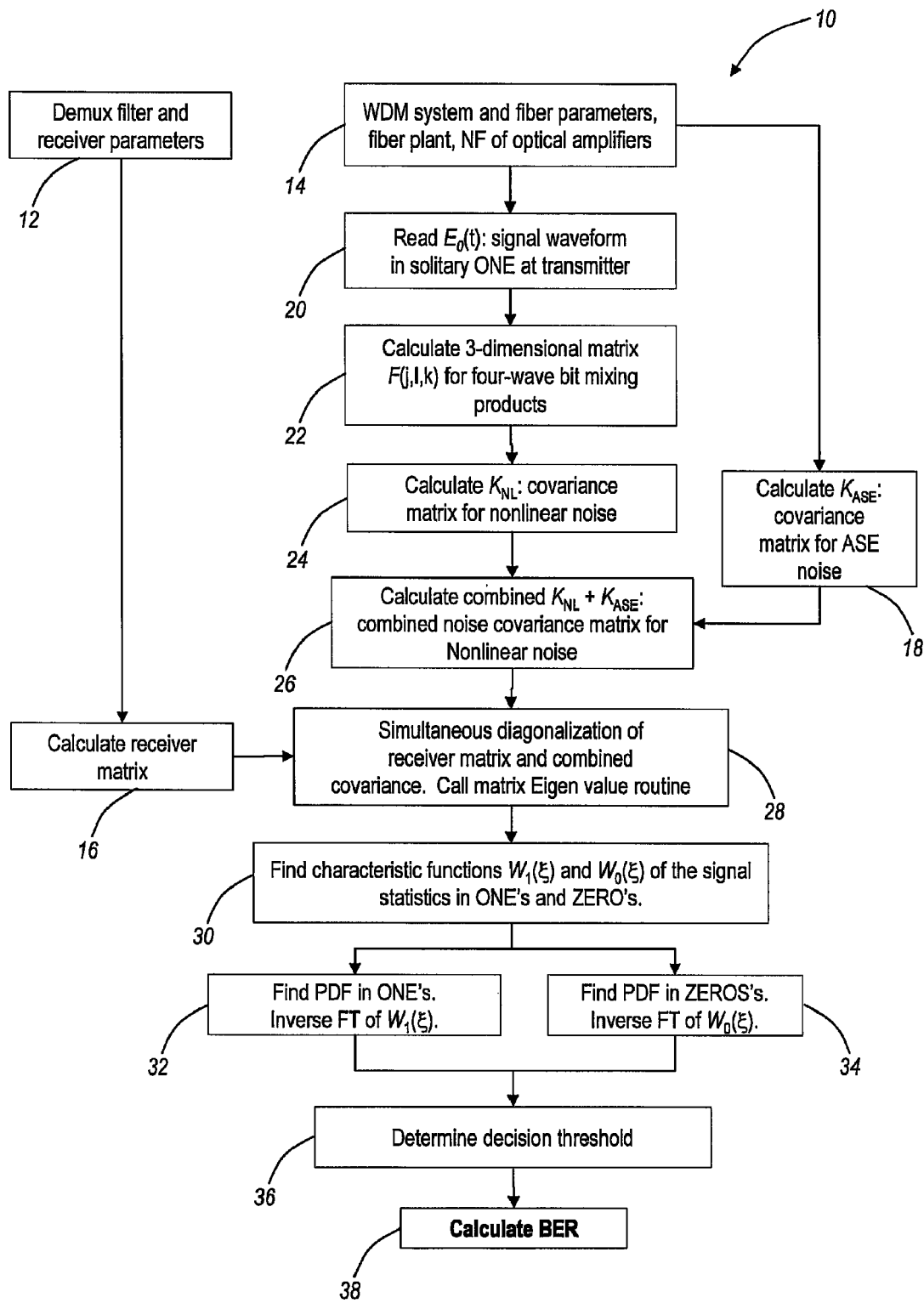
FIG. 1 is a flow chart of a highly efficient technique for bit error rate (BER) modeling in a quasi-linear communication system according to an exemplary embodiment of the present invention.

In various exemplary embodiments, the present invention provides a highly computationally efficient semi-analytical technique for modeling BER in quasi-linear communication systems, such as WDM optical systems. The present invention avoids both the Monte Carlo and Karhunen-Loéve simulation techniques and does not use PRBS signals. Advantageously, the present invention is capable of calculating BER within one minute using a conventional single processor 2 GHz computer, i.e. an improvement of several orders of magnitude. In the present invention, nonlinear noise, due to four-wave mixing (FWM) and cross-phase modulation (XPM), is treated within a linearization approach along with the amplified spontaneous emission (ASE) noise, and the nonlinear noise is considered as another source of noise in addition to the ASE noise.

Advantageously, the present invention provides a dramatic (at least two orders of magnitude) increase of the computational efficiency in BER calculation for a given computer. This is achieved by applying a unique quasi-analytical approach to the BER calculation. In this quasi-analytical approach, the most CPU time consuming part of the calculation is performed analytically which results in such a dramatic gain of the computational efficiency.

It has been shown in R. Holzlöhner, V. S. Grigoryan, C. R. Menyuk, and W. L. Kath, "Accurate calculation of eye diagrams and error rates in long-haul transmission systems using linearization," Journal of Lightwave Technology, Vol. 20, No. 3, pp. 389-400, March 2002, the contents of which are incorporated in full by reference herein, that in a nonlinear system, the optical field pdf represents a multi-variate Gaussian distribution when the amplified spontaneous emission (ASE) noise, generated by optical amplifiers, nonlinearly interacts with the signal due to the four-wave mixing (FWM) between the signal and the noise. This result was obtained and validated based on the linearization and covariance matrix formalism developed in the referred paper.

However, in the later approach the Monte Carlo simulations using PRBS signals were still needed to account for the noise associated with the data pattern—i.e., dependent signal-signal nonlinear interactions. The emphasis in the referred paper was put on ultra-long haul (transoceanic type), highly nonlinear systems, in which the signal-signal nonlinear interactions could be strong and could not be treated within the linearization approach.

Most terrestrial fiber links represent quasi-linear systems, in which the impact of the noise due to the fiber nonlinearity on the signal integrity is weaker than the linear effects such as the loss, gain, and chromatic dispersion. In a quasi-linear system, the nonlinear noise is, typically, on the same order or weaker than the ASE noise. Unlike ultra-long haul systems, for a quasi-linear system, the nonlinear signal distortion can be treated within the linearization approach and considered as another source of noise in addition to the ASE noise. In that case, the linearization and covariance matrix formalism referred above can be applied.

The present invention applies a quasi-analytical approach to the BER calculation. In such a quasi-analytical approach, a major part of the calculation is performed analytically which results in a dramatic gain of the computational efficiency. Schematically, the outline of the quasi-analytical approach includes three main steps (with sub-steps included) as follows. First, a covariance matrix is found. An equation is derived for a noise component of a signal and an implicit analytical solution is found depending on the signal and system parameters. The covariance matrix is analytically computed.

Second, pdfs are computed for logical ONEs and logical ZEROs associated with the signal. An analytical calculation is performed of the characteristic function for the noise statistics. Next, a numerical computation of the Fourier transform of the characteristic function is preformed to yield the pdf for the logical ONE and logical ZERO in question. Third, numerical integration is performed on the pdfs for the logical ONE and logical ZERO which yields the BER in question.

Referring to FIG. 1, a flow chart illustrates a highly efficient technique 10 of BER modeling in a quasi-linear communication according to an exemplary embodiment of the present invention. The highly efficient technique 10 performs a calculation of a unified covariance matrix due to both the nonlinear noise and the ASE noise assuming that the signal optical field pdf is characterized by a multi-variate Gaussian distribution.

The highly efficient technique 10 starts with receiving demultiplexer filter and receiver parameters (step 12) and WDM system and fiber parameters, fiber plant parameters, and a noise figure (NF) of optical amplifiers (step 14). The demultiplexer filter and receiver parameters are utilized to calculate a receiver matrix (step 16). The WDM system and fiber parameters, fiber plant parameters, and the noise figure (NF) are utilized to calculate a covariance matrix, $K_{ASE}$, for ASE noise (step 18).

Next, the highly efficient technique 10 reads a signal waveform, $E_0(t)$, in a solitary ONE at a transmitter (step 20). A 3-dimensional matrix $F(j,l,k)$ is calculated for four-wave bit mixing products (step 22). A covariance matrix, $K_{NL}$, is calculated for nonlinear noise (step 24). A combined noise covariance matrix, $K_{NL}+K_{ASE}$, for nonlinear noise is calculated (step 26). The receiver matrix and the combined covariance matrix, $K_{NL}+K_{ASE}$, are simultaneously diagonalized by using a matrix Eigen value routine (step 28).

The highly efficient technique 10 finds characteristic functions $W_1(\xi)$ and $W_0(\xi)$ of the signal statistics in ONE's and ZERO's (step 30). The pdf in the ONE's is computed as the inverse Fourier transform of $W_1(\xi)$ (step 32), and the pdf in the ZERO's is computed as the inverse Fourier transform of $W_0(\xi)$ (step 34). A decision threshold is determined (step 36), and the BER is calculated accordingly (step 38).

The highly efficient technique 10 starts with the nonlinear Schrödinger equation in the Langevin form (see Eq. (1) in R. Holzlöhner et al. "Accurate calculation of eye diagrams and error rates in long-haul transmission systems using linearization", Journal of Lightwave Technology, Vol. 20, No. 3, pp. 389-400, March 2002) written in the Fourier domain for an electric field:

$$u(z, t) = \sum_n u_n(z, t) \cdot \exp(i\Omega_n t)$$

$$u_n(z, t) = \sum_r \alpha_{nr} u_{nr}(z, t)$$

Where $u_n(z,t)$ is the field in the n-th channel, nr is a double index with n designating the channel count and r designating the bit count in the n-th channel, $\alpha_{nr}$ is the digital data random number defined by a modulation format, $u_{nr}(z,t)$ is the signal field in the nr-th bit, and $\Omega_n$ is the frequency of the n-th channel.

At the input $u_{nr}(z=0,t)=u^0(t-rT_b-\theta_n)$, so that $u^0(t)$ represents a building block waveform of the bit sequence, $T_b$ is the bit length, $\theta_n$, is the relative n-th channel delay.

The signal Fourier component $\mathcal{A}_n(\omega)$, defined as $$u_n = \sum_\omega \mathcal{A}_n(\omega)\exp(i\omega t),$$

is represented as $A_n(\omega)+a_n(\omega)$, where $A_n(\omega)$ is the noiseless signal and $a_n(\omega)$ is the noise, due to the nonlinearity and ASE.

Linearizing around the noiseless signal, the following equation for the noise is obtained:

$$i\frac{da_n(\omega)}{dz} - \left[ig(z) + \frac{D(z)}{2}(\Omega_n + \omega)^2\right]a_n(\omega) = -NL_\omega + \hat{f}_\omega(z), \quad (1)$$

where $g(z)$ is the material gain-loss, $D(z)$ is the dispersion, $NL_\omega$ is the $\omega$ Fourier component of the combined four-wave mixing (FWM) and cross phase modulation (XPM) term $$\gamma(z) \sum_{j,l,k} u_j u_l u_k^*,$$

which includes only the terms with $\Omega_j + \Omega_l = \Omega_k + \Omega_n$, y(z) is the nonlinearity coefficient, $\hat{f}_\omega(z)$ is the delta-correlated ASE noise and $A_n(\omega)$ simply obeys the linear equation (1) with $NL_\omega = \hat{f}_\omega(z) = 0$. Assuming that in a quasi-linear system the noise is significantly smaller than the signal, Eq. (1) is integrated keeping in $NL_\omega$ and only the noiseless terms $A_n(\omega)$ to obtain that:

$$a_n(\omega) = a_n^{NL}(\omega) + a_n^{ASE}(\omega) \quad (2)$$

where $$a_n^{NL}(\omega) = i \sum_{jr_1, lr_2, kr_3} \alpha_{jr_1} \alpha_{lr_2} \alpha_{kr_3}^* C_{jr_1, lr_2, kr_3}^\omega,$$

and $$C_{jr_1, lr_2, kr_3}^\omega = \sum_{\omega_1, \omega_2} B(\omega_1) B(\omega_2) B^*(\omega_1 + \omega_2) e^{\left[ \begin{array}{c} -i\omega_1(r_1 T_b + \theta_j) - i\omega_2(r_2 T_b + \theta_l) + \\ i(\omega_1 + \omega_2 - \omega)(r_3 T_b + \theta_k) \end{array} \right]} R$$

is the FWM product of the $jr_1$, $lr_2$, and $kr_3$ bits, $B(\omega)$ is the Fourier transform of $u^0(t)$, R is the distance dependent amplitude-phase term and R equals:

$$R = \exp\left\{ \int_0^z \left[ g(x) - \frac{i}{2} (\Omega_n + \omega)^2 D(x) \right] dx \right\} \quad (3)$$

$$\int_0^z \gamma(x) \exp\left\{ \int_0^x [2g(x) - i\delta k(x)] dx \right\}$$

$\delta k(z)$ is the wave number mismatch and $\delta k(z)$ equals:

$\delta k(z) = 0.5 D(z) [(\Omega_j + \omega_1)^2 + (\Omega_l + \omega_2)^2 - (\Omega_k + \omega_1 + \omega_2 - \omega)^2 - (\Omega_n + \omega)^2]$, and $a_n^{ASE}(\omega)$ is the accumulated ASE noise.

Using Eq. (2), the covariance matrix $K_{pq} = \langle a_n(\omega_p) a^*_n(\omega_q) \rangle$ can be calculated with the average taken over all the data realizations $\alpha_{nr}$ in all of the channels and the ASE noise realizations. Because the nonlinear noise and ASE noise are statistically independent in this approximation, $K_{pq} = K_{pq}^{NL} + K_{pq}^{ASE}$, where $K_{pq}^{NL} = \langle a_n^{NL}(\omega_p) a_n^{NL*}(\omega_q) \rangle$, $K_{pq}^{ASE}$ is a diagonal matrix $\delta_{pq} P_m$, where the ASE noise power per mode after the m-th span with $\Gamma_m$ loss followed by the m-th amplifier with $G_m$ gain is $P_m = P_{m-1} \Gamma_m G_m + n_{sp} \hbar \omega_0 (G_m - 1) \Delta v$, $n_{sp}$ is the spontaneous emission factor and $\Delta v$ is the mode spacing. One can see from Eq. (2) that $K_{pq}^{NL}$ depends on the data statistics which, in its turn, depends on the modulation format.

For example, consider a duo-binary (DB) modulation format, in which:

$\alpha_{nr} = (\beta_{n,r} + \beta_{n,r-1}) \exp(i\phi_n)/2,$ where $\beta_{n,r}$ is 1 or $-1$, and $\phi_n$ is the phase bias of the n-th channel. A specific feature of the DB format is that the adjacent bits are pair-wise correlated. In calculation of $K_{pq}^{NL}$, it can be use that, first, all $\beta_{n,r}$ with different n or r are statistically independent and, second, $\langle \beta_{n,r} \rangle = 0$, whereas $\langle \beta_{n,r}^2 \rangle = 1$.

Note, that the XPM products in Eq. (2) add up in-phase when l=k, j=n, $\omega_1 = \omega$ (or j=k, l=n, $\omega_2 = \omega$), as their phase mismatch $\delta k(z) = 0$, whereas the phases of the FWM products vary over distance as their phase mismatch $\delta k(z) \neq 0$. Having calculated the covariance matrix $K_{pq}$, the Karhunen-Loéve expansion (or the simultaneous diagonalization of the receiver and covariance matrices) technique is applied, such as described in detail in R. Holzlöhner et al. "Accurate calculation of eye diagrams and error rates in long-haul transmission systems using linearization", Journal of Lightwave Technology, Vol. 20, No. 3, pp. 389-400, March 2002, and compute the signal pdf.

In contrast to the linearization approach developed in R. Holzlöhner et al. paper, with only the ASE-initiated noise, the covariance matrix in the present invention can be strongly non-diagonal because of the strong correlations between different Fourier modes due to the FWM. The present invention avoids using a split-step fast Fourier transform (FFT) algorithm for simulating long bit sequences. Instead, the present invention uses the FFT only twice: to Fourier transform a one bit waveform $u^0(t)$ at the input and to compute the Fourier integral for the characteristic function at the output. This allows a drastic reduction in the CPU time.

Figure 2:
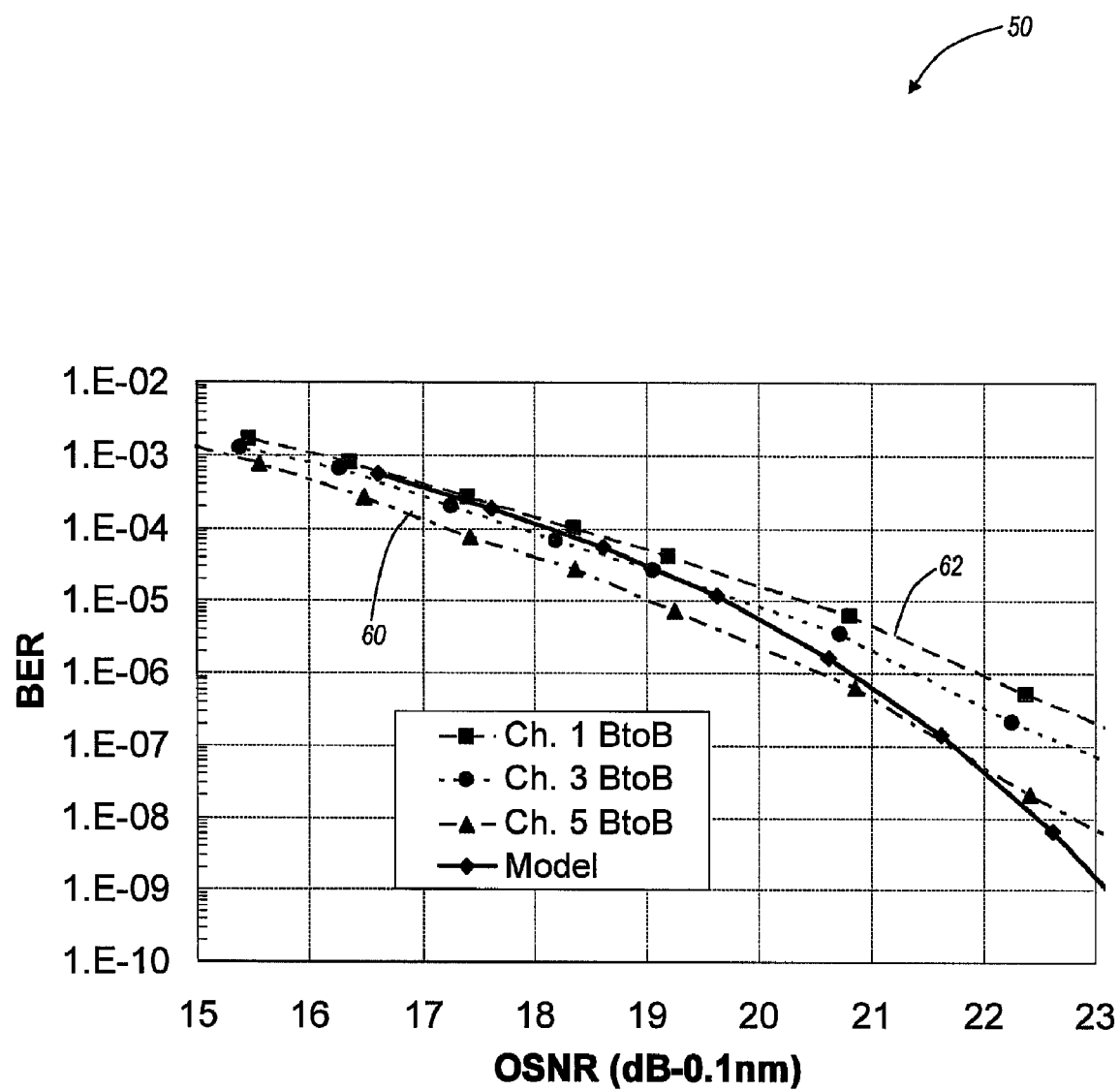
FIGS. 2-4 are graphs of an exemplary operation of the highly efficient technique for BER modeling in quasi-liner fiber communication networks, based on BER measurements in a 40 Gb/s WDM testbed, according to an exemplary embodiment of the present invention.
Figure 3:
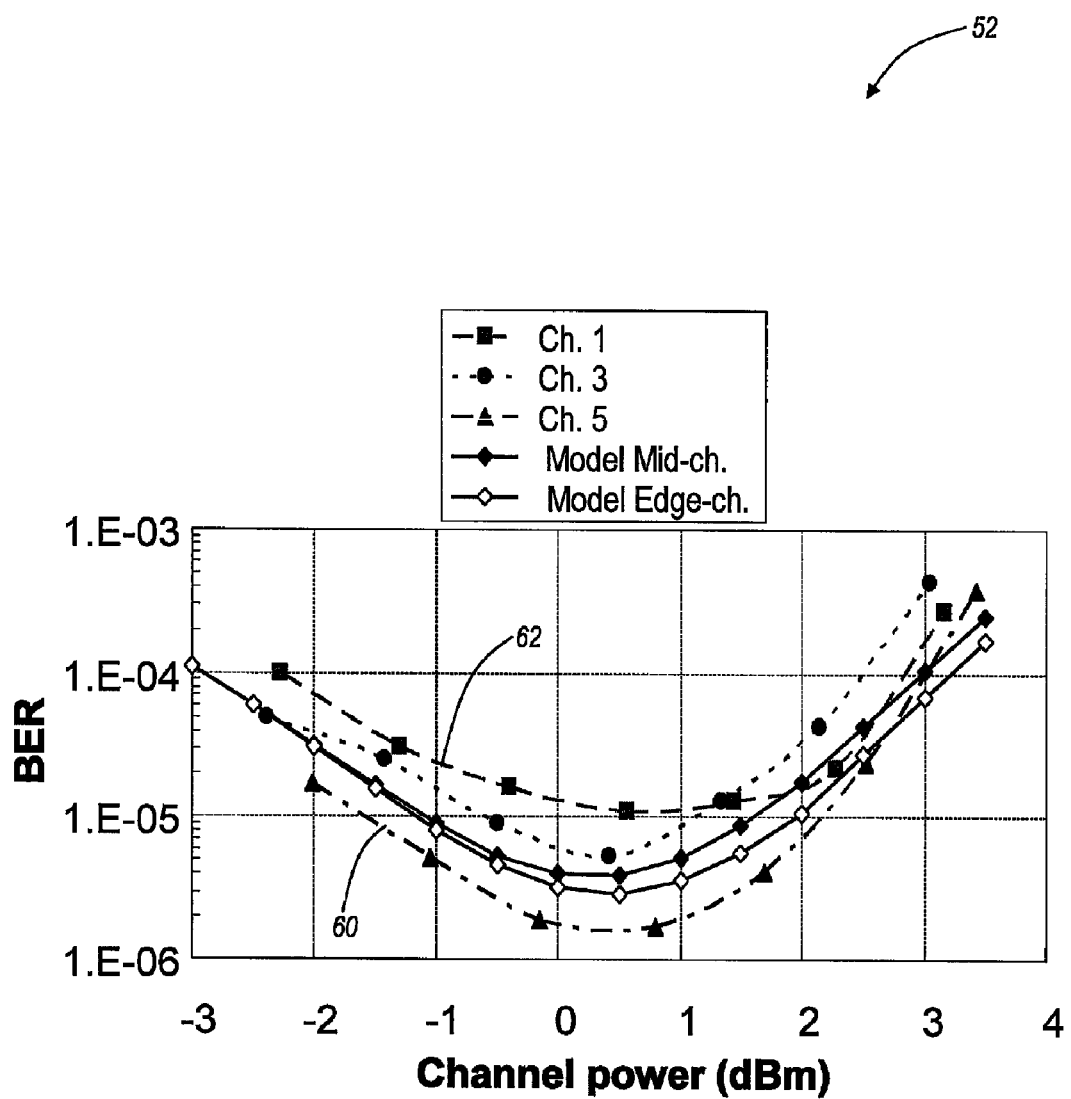
Figure 4:
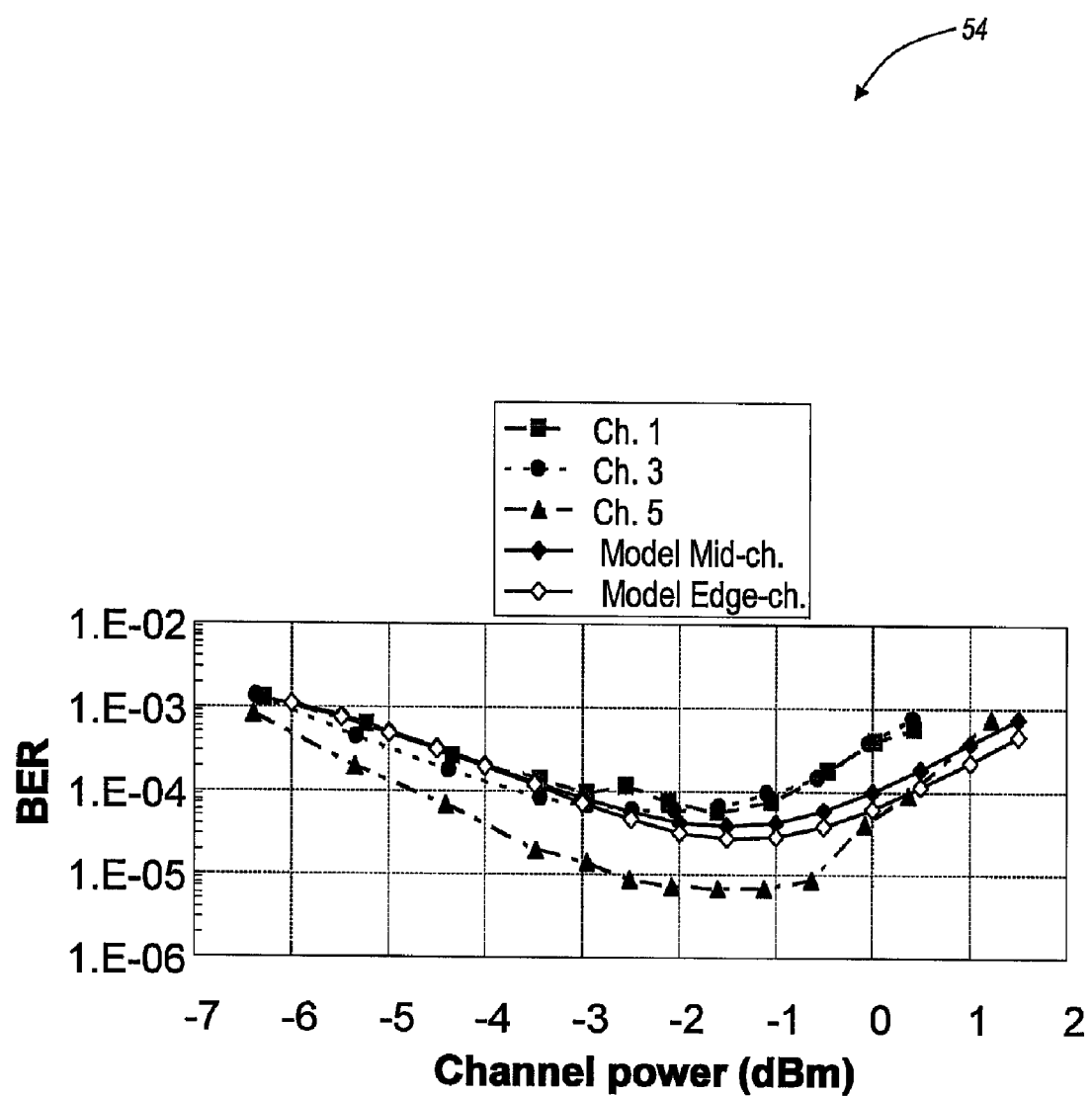

Referring to FIGS. 2-4, graphs 50, 52, 54 illustrate an exemplary operation of the highly efficient technique for BER modeling in quasi-liner fiber communication networks, based on BER measurements in a 40 Gb/s WDM testbed, according to an exemplary embodiment of the present invention. Accuracy of half an order of magnitude for BER and less than 0.25 dBm for the optimum channel power (the power at which BER is at the minimum) is achieved. In the testbed, two types of fiber links are used: non-dispersion shifted fiber (NDSF)-based and Truewave Classic (TWCL) fiber-based links.

The NDSF testbed link included 10 spans by 80-km with 21-dB-loss spans of NDSF with 11 amplifiers to compensate loss. Measurements on the TWCL fiber were made through 8 spans by 75-km with 21-dB-loss spans and 9 amplifiers. The loss of the amplifier mid-stage was 9 dB which included the loss of a variable optical attenuator (VOA) and a dispersion compensation module (DCM). There were five 42.8 Gb/s DB modulated channels that are referred to as ch. 1-5 at wavelengths 1560.2 nm, 1560.106 nm, 1561.013 nm, 1561.419 nm, and 1561.826 nm respectively. There were also 57 10 Gb/s non-return-to-zero (NRZ) channels to load the amplifiers with no 10 Gb/s channel being closer than 350 GHz from a 40 Gb/s channel. The dispersion maps used for the NDSF and TWCL measurements were optimized for 10 Gb/s channels with about 92% compensation per span and nearly equal amounts of pre- and post dispersion compensation to yield about zero residual dispersion.

In the TWCL map, short lengths of NDSF and DCM's made for LEAF were used to compensate the dispersion of the TWCL. The linear crosstalk between the 42.8 Gb/s channels through the multiplexer and demultiplexer filters was measured to be <0.2 dBQ at $10^{-5}$ BER.

In the model, fiber parameters were used according to the specifications for the fiber spans used in the experiment, i.e. NDSF and TWCL links with average $D_{TWCL} = 3.45$ ps/nm-km. The receiver was modeled as a square-law detector followed by a 5-th order Bessel filter with 3 dB bandwidth of 80% of the bit rate.

In the model, $u^0(t) = 0.5[1 + \sin(\pi \cdot t/T_b)]$ for $-T_b/2 \leq t < 3T_b/2$ and 0 elsewhere, in which case $$u_n(z, t) = \sum_r \alpha_{nr} u^0(t - rT_b)$$

is a good emulation of a DB NRZ signal.

FIG. 2 illustrates back-to-back (BtoB) BER measurements versus optical signal-to-noise ratio (OSNR) at 1 dBm channel power. The graph 50 demonstrates a good agreement with the model in the OSNR range of up to approximately 21.5 dB. For OSNR>21.5 dB, the modeled BER rolls down as the receiver noise is neglected in the model.

FIGS. 3 and 4 illustrate BER measurements versus optical channel power in dBm for chs. 1, 3, and 5 and the model middle channel and model edge channel calculations. Graph 52 is the NDSF link with OSNR=21.8 dB at 0.5 dBm channel power. Graph 54 is the TWCL link with OSNR=21.8 dB at −0.5 dBm channel power. Graphs 52, 54 also show a good agreement with the BER measurements both in terms of the optimum channel power and minimum BER for both NDSF and TWCL links with the optimum channel power for the TWCL link being about 0.5 dBm higher in the model.

In graphs 50, 52, a larger BER for the left edge of ch. 1 (i.e., line 60) relative to the right edge ch. 5 (i.e., line 62) is attributed to a better back-to-back performance of ch. 5. The best BER measured for ch. 3 is $5.3 \times 10^{-6}$ versus BER=$3.95 \times 10^{-6}$ predicted by the model at 0.5 dBm channel power. Note also that although in the model in graphs 52, 54 the edge channel BER is better than the mid-channel BER, the difference is not significant. Hence, a noticeably worse performance of the ch. 3 relative to ch. 5 can not be attributed only to larger nonlinear penalties in the mid-channel but also (and mainly) to a worse back-to-back performance in the ch. 3.

Figure 5:
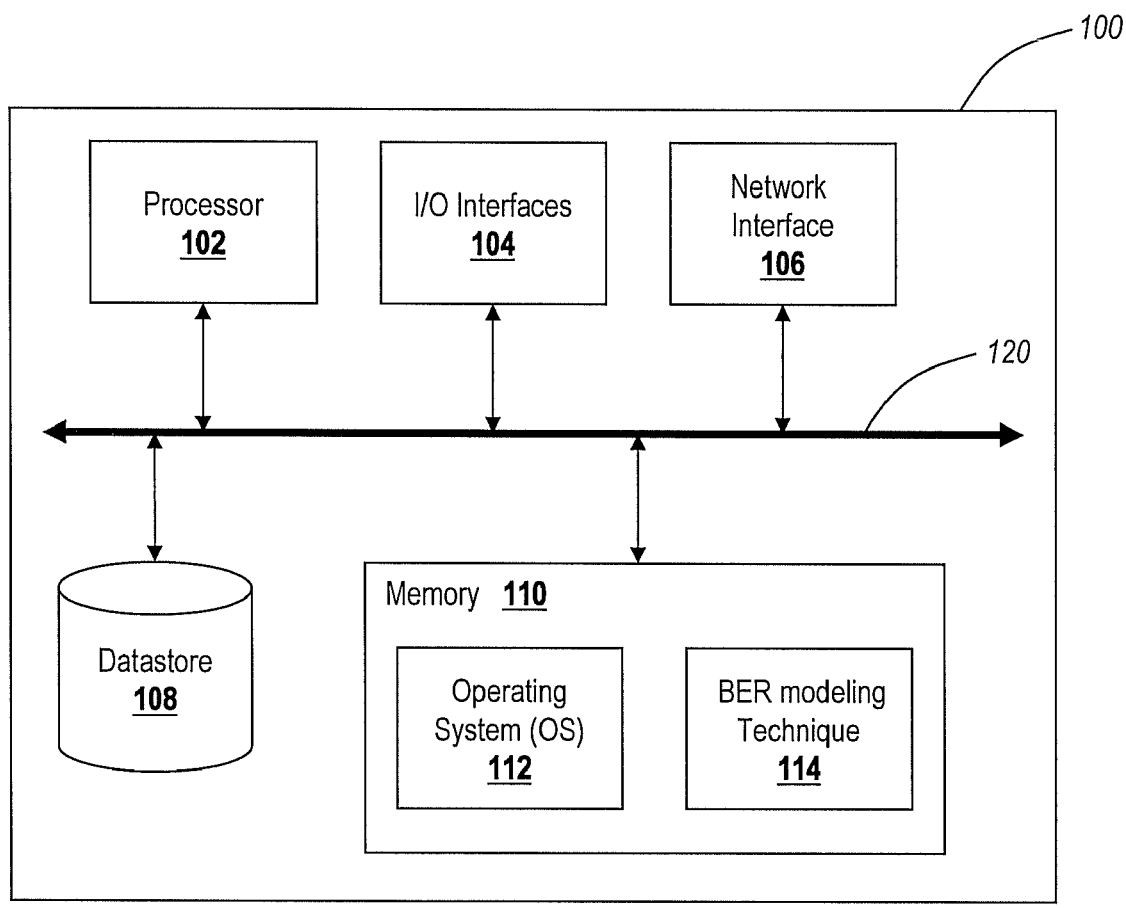
FIG. 5 is a block diagram of a computer configured to perform the highly efficient technique for BER modeling in a quasi-linear communication system according to an exemplary embodiment of the present invention.

Referring to FIG. 5, a block diagram illustrates a server 100 having a BER modeling technique 114, according to an exemplary embodiment of the present invention. The server 100 can be a digital computer that, in terms of hardware architecture, generally includes a processor 102, input/output (I/O) interfaces 104, network interfaces 106, memory 110, and a data store 108. In an exemplary embodiment, the server 100 is configured to perform the BER modeling technique 114 as described herein.

The components (102,104,106,108,110) are communicatively coupled via a local interface 120. The local interface 120 can be, for example but not limited to, one or more buses or other wired or wireless connections, as is known in the art. The local interface 120 can have additional elements, which are omitted for simplicity, such as controllers, buffers (caches), drivers, repeaters, and receivers, among many others, to enable communications. Further, the local interface 120 can include address, control, and/or data connections to enable appropriate communications among the aforementioned components.

The processor 102 is a hardware device for executing software instructions. The processor 102 can be any custom made or commercially available processor, a central processing unit (CPU), an auxiliary processor among several processors associated with the server 100, a semiconductor-based microprocessor (in the form of a microchip or chip set), or generally any device for executing software instructions. When the server 100 is in operation, the processor 102 is configured to execute software stored within the memory 110, to communicate data to and from the memory 110, and to generally control operations of the server 100 pursuant to the software instructions.

The I/O interfaces 104 can be used to receive user input from and/or for providing system output to one or more devices or components. User input can be provided via, for example, a keyboard and/or a mouse. System output can be provided via a display device and a printer (not shown). I/O interfaces 104 can include, for example, a serial port, a parallel port, a small computer system interface (SCSI), an infrared (IR) interface, a radio frequency (RF) interface, and/or a universal serial bus (USB) interface.

The network interfaces 108 can be used to enable the server 100 to communicate on a network. The network interfaces 106 can include, for example, an Ethernet card (e.g., 10BaseT, Fast Ethernet, Gigabit Ethernet) or a wireless local area network (WLAN) card (e.g., 802.11a/b/g). The network interfaces 106 can include address, control, and/or data connections to enable appropriate communications on the network.

A data store 108 can be used to store data, such as information received from NEs. The data store 108 can include any of volatile memory elements (e.g., random access memory (RAM, such as DRAM, SRAM, SDRAM, and the like)), nonvolatile memory elements (e.g., ROM, hard drive, tape, CDROM, and the like), and combinations thereof. Moreover, the data store 108 can incorporate electronic, magnetic, optical, and/or other types of storage media.

The memory 110 can include any of volatile memory elements (e.g., random access memory (RAM, such as DRAM, SRAM, SDRAM, etc.)), nonvolatile memory elements (e.g., ROM, hard drive, tape, CDROM, etc.), and combinations thereof. Moreover, the memory 110 may incorporate electronic, magnetic, optical, and/or other types of storage media. Note that the memory 110 can have a distributed architecture, where various components are situated remotely from one another, but can be accessed by the processor 102.

The software in memory 110 can include one or more software programs, each of which includes an ordered listing of executable instructions for implementing logical functions. The software in the memory system 110 includes the BER modeling technique 114 and a suitable operating system (O/S) 112. The operating system 112 essentially controls the execution of other computer programs, such as the BER modeling technique 114, and provides scheduling, input-output control, file and data management, memory management, and communication control and related services.

In an exemplary embodiment of the present invention, the BER modeling technique 114 is configured to perform the algorithms described herein, such as in FIG. 1, to provide computationally efficient BER modeling for quasi-linear communication systems. The BER modeling technique 114 can be integrated within a communication simulation tool for network designs. Advantageously, the BER modeling technique 114 can dramatically enhance computational efficiency of such tools.

Although the present invention has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention and are intended to be covered by the following claims.

What is claimed is:

1. A bit error rate modeling method for quasi-linear communication systems, comprising:
   analytically calculating a combined covariance matrix for noise;
   computing probability distribution functions from the combined covariance matrix;

numerically integrating the probability distribution functions to provide a modeled bit error rate;
wherein the use of a split-step fast Fourier transformation is avoided for the simulation of long bit sequences and a numerical Fourier transformation is used only to transform a one bit waveform at an input and to compute an integral for a characteristic function at an output; and
simulating and configuring a network using the modeled bit error rate.

2. The bit error rate modeling method of claim 1, wherein the noise comprises nonlinear noise and amplified spontaneous emission noise.

3. The bit error rate modeling method of claim 2, wherein the probability distribution functions are characterized by a multi-variate Gaussian distribution.

4. The bit error rate modeling method of claim 2, wherein the nonlinear noise and amplified spontaneous emission noise are both derived based upon an analytical solution; and
wherein the nonlinear noise and amplified spontaneous emission noise are approximated as statistically independent.

5. The bit error rate modeling method of claim 4, wherein the combined covariance matrix, $K_{pq}$, is equal to $K_{pq}=K_{pq}^{NL}+K_{pq}^{ASE}$;
wherein $K_{pq}^{ASE}$ is a diagonal matrix of the amplified spontaneous emission noise; and
wherein $K_{pq}^{NL}$ is a matrix of the nonlinear noise, and wherein $K_{pq}^{NL}$ is responsive to data statistics of a received optical signal.

6. The bit error rate modeling method of claim 2, wherein the computing probability distribution functions comprises a computation of a probability distribution function for a logical ONE and a probability distribution function for a logical ZERO; and
wherein the computation of the probability distribution function for the logical ONE and the probability distribution function for the logical ZERO each comprise:
analytically calculating a characteristic function from noise statistics; and
numerically computing a Fourier transform of the characteristic function.

7. The bit error rate modeling method of claim 2, wherein the computing probability distribution functions comprises one of a Karhunen-Loéve expansion and a simultaneous diagonalization of a receiver matrix and the combined covariance matrix.

8. The bit error rate modeling method of claim 1, wherein in the quasi-linear communication system, the nonlinear noise is treated within a linearization approach along with the amplified spontaneous emission noise, and wherein the nonlinear noise is considered as another source of noise in addition to the amplified spontaneous emission noise.

9. A bit error rate modeling method for quasi-linear optical communication systems, comprising:
providing a plurality of parameters associated with a quasi-linear optical communication system;
calculating noise in the quasi-linear optical communication system utilizing the plurality of parameters;
analytically calculating a covariance matrix responsive to the calculated noise;
computing a probability distribution function from the covariance matrix;
computing a modeled bit error rate through a numerical integration of the probability distribution function;
wherein the use of a split-step fast Fourier transformation is avoided for the simulation of long bit sequences and a numerical Fourier transformation is used only to transform a one bit waveform at an input and to compute an integral for a characteristic function at an output; and
simulating and configuring a network using the modeled bit error rate.

10. The bit error rate modeling method of claim 9, wherein the calculated noise comprises nonlinear noise and amplified spontaneous emission noise; and
wherein in the optical quasi-linear communication system, the nonlinear noise is treated within a linearization approach along with the amplified spontaneous emission noise, and wherein the nonlinear noise is considered as another source of noise in addition to the amplified spontaneous emission noise.

11. The bit error rate modeling method of claim 10, wherein the probability distribution function is characterized by a multi-variate Gaussian distribution.

12. The bit error rate modeling method of claim 10, wherein the nonlinear noise and amplified spontaneous emission noise are both derived based upon an analytical solution; and
wherein the nonlinear noise and amplified spontaneous emission noise are approximated as statistically independent.

13. The bit error rate modeling method of claim 12, wherein the combined covariance matrix, $K_{pq}$, is equal to $K_{pq}=K_{pq}^{NL}+K_{pq}^{ASE}$;
wherein $K_{pq}^{ASE}$ is a diagonal matrix of the amplified spontaneous emission noise; and
wherein $K_{pq}^{NL}$ is a matrix of the nonlinear noise, and wherein $K_{pq}^{NL}$ is responsive to the plurality of parameters associated with a quasi-linear optical communication system.

14. The bit error rate modeling method of claim 13, wherein the plurality of parameters comprises one of a read optical signal waveform in a solitary ONE at a transmitter, demultiplexer parameters, receiver parameters, fiber parameters, fiber plant characteristics, noise figure of optical amplifiers, signal modulation format, and a combination thereof.

15. The bit error rate modeling method of claim 10, wherein the computing a probability distribution function comprises a computation of a probability distribution function for a logical ONE and a probability distribution function for a logical ZERO; and
wherein the computation of the probability distribution function for the logical ONE and the probability distribution function for the logical ZERO each comprise:
analytically calculating a characteristic function from noise statistics; and
numerically computing a Fourier transform of the characteristic function.

16. The bit error rate modeling method of claim 10, wherein the computing a probability distribution function comprises one of a Karhunen-Loéve expansion and a simultaneous diagonalization of a receiver matrix and the combined covariance matrix.

17. A bit error rate modeling system for quasi-linear communication systems, comprising:
a data store;
input/output interfaces;
memory; and
a processor coupled to each of the data store, the input/output interfaces, and the memory; wherein the processor is configured to:
analytically calculate a combined covariance matrix for noise responsive to one or more input values received from the input/output interfaces, the data store, and the memory;

compute probability distribution functions from the combined covariance matrix; and numerically integrate the probability distribution functions to provide a modeled bit error rate wherein the use of a split-step fast Fourier transformation is avoided for the simulation of long bit sequences and a numerical Fourier transformation is used only to transform a one bit waveform at an input and to compute an integral for a characteristic function at an output.

18. The bit error rate modeling system of claim 17, wherein the noise comprises nonlinear noise and amplified spontaneous emission noise;

wherein in the quasi-linear communication system, the nonlinear noise is treated within a linearization approach along with the amplified spontaneous emission noise, and wherein the nonlinear noise is considered as another source of noise in addition to the amplified spontaneous emission noise; and wherein the probability distribution functions are characterized by a multi-variate Gaussian distribution.

19. The bit error rate modeling system of claim 18, wherein the nonlinear noise and amplified spontaneous emission noise are both derived based upon an analytical solution;

wherein the nonlinear noise and amplified spontaneous emission noise are approximated as statistically independent;

wherein the combined covariance matrix, $K_{pq}$, is equal to $K_{pq} = K_{pq}^{NL} + K_{pq}^{ASE}$;

wherein $K_{pq}^{ASE}$ is a diagonal matrix of the amplified spontaneous emission noise; and wherein $K_{pq}^{NL}$ is a matrix of the nonlinear noise, and wherein $K_{pq}^{NL}$ is responsive to data statistics of a received optical signal.

20. The bit error rate modeling system of claim 18, wherein to compute probability distribution functions comprises a computation of a probability distribution function for a logical ONE and a probability distribution function for a logical ZERO;

wherein the computation of the probability distribution function for the logical ONE and the probability distribution function for the logical ZERO each comprise:

analytically calculating a characteristic function from noise statistics; and numerically computing a Fourier transform of the characteristic function; and wherein to compute probability distribution functions comprises one of a Karhunen-Loéve expansion and a simultaneous diagonalization of a receiver matrix and the combined covariance matrix.

* * * * *